United States Patent
Hahn (10) Patent No.: US 9,323,605 B2
(45) Date of Patent: Apr. 26, 2016

(54) MEASURED VALUE TRANSMITTING DEVICE

(75) Inventor: Uwe Hahn, Esslingen (DE)

(73) Assignee: Balluff GmbH, Neuhausen a.d.F. (DE)

( * ) Notice: Subject to any disclaimer, the term of this patent is extended or adjusted under 35 U.S.C. 154(b) by 192 days.

(21) Appl. No.: 14/238,078

(22) PCT Filed: Aug. 11, 2011

(86) PCT No.: PCT/DE2011/001576
§ 371 (c)(1),
(2), (4) Date: Feb. 28, 2014

(87) PCT Pub. No.: WO2013/020529
PCT Pub. Date: Feb. 14, 2013

(65) Prior Publication Data
US 2014/0173391 A1 Jun. 19, 2014

(51) Int. Cl.
*G06F 11/10* (2006.01)
*H03K 3/3562* (2006.01)
(Continued)

(52) U.S. Cl.
CPC .............. *G06F 11/1004* (2013.01); *G06F 5/06* (2013.01); *G08C 19/28* (2013.01); *H03K 3/3562* (2013.01); *H04L 1/0045* (2013.01); *H04L 7/0008* (2013.01); *H04L 25/45* (2013.01); *H04L 1/0061* (2013.01)

(58) Field of Classification Search
CPC .... H03K 3/3562; H04L 1/0045; H04L 24/45; H04L 1/0061; H04L 7/0008; G06F 11/1004; G06F 5/06; G08C 19/28
See application file for complete search history.

(56) References Cited

U.S. PATENT DOCUMENTS

| 5,745,479 A | * | 4/1998 | Burns | ................... H04L 1/0083 370/245 |
| 6,064,248 A | | 5/2000 | Seki | |

(Continued)

FOREIGN PATENT DOCUMENTS

| DE | 101 13 716 A1 | 10/2002 |
| DE | 10 2004 025 388 B4 | 6/2006 |

(Continued)

OTHER PUBLICATIONS

English Machine Translation of Takashi, Japanese Unexamined Patent Publication No. H09-093233, created Oct. 18, 2015, 12 pages.*

(Continued)

*Primary Examiner* — Albert Decady
*Assistant Examiner* — Kyle Vallecillo
(74) *Attorney, Agent, or Firm* — Collard & Roe, P.C.

(57) ABSTRACT

A measured value transmitting device for serially transmitting data in accordance with the SSI method, includes a slave providing the data bits of a measured value detected by a sensor for serial bit-by-bit transmission to a master. The master requests a measured value from the slave with a clock burst having multiple clock cycles matching the number of data bits to be transmitted. In a first device, the clock cycles have a specified duty cycle corresponding to the ratio of the pulse duration to the period duration of one clock cycle, and the master contains a comparator. The master reads the clock bursts outputted on the clock line and checks the duty cycle in the comparator to determine whether an upper and/or lower threshold has been exceeded. In a second device a corresponding check of the duty cycle is carried out in the slave.

13 Claims, 5 Drawing Sheets

(51) Int. Cl.
*H04L 1/00* (2006.01)
*G08C 19/28* (2006.01)
*H04L 7/00* (2006.01)
*H04L 25/45* (2006.01)
*G06F 5/06* (2006.01)

(56) References Cited

U.S. PATENT DOCUMENTS

| | | | |
|---|---|---|---|
| 6,188,737 B1 * | 2/2001 | Bruce | H04L 25/062 375/214 |
| 7,430,236 B2 | 9/2008 | Eberle et al. | |
| 7,840,881 B2 * | 11/2010 | Ishiwaki | H03M 13/09 714/781 |
| 2003/0026330 A1 | 2/2003 | Ehling | |
| 2003/0053547 A1 | 3/2003 | Aberl et al. | |
| 2005/0001488 A1 | 1/2005 | Yamada | |
| 2006/0140321 A1 * | 6/2006 | Tell | H03L 7/0814 375/376 |

FOREIGN PATENT DOCUMENTS

| | | |
|---|---|---|
| EP | 0 171 579 A1 | 2/1986 |
| EP | 1 294 119 A1 | 3/2003 |
| JP | H02-002235 A | 1/1990 |
| JP | 09093233 A * | 4/1997 |
| JP | H09-093233 A | 4/1997 |
| JP | H10-117131 A | 5/1998 |
| JP | H10-308655 A | 11/1998 |

OTHER PUBLICATIONS

International Search Report of PCT/DE2011/001576, mailed Apr. 11, 2012.

Cyclic redundancy check, retrieved Feb. 10, 2014 from http://en.wikipedia.org/wiki/Cyclic_redundancy_check.

Oudjida, A. K. et al, "Design and test of general-purpose SPI Master/Slave IPs on OPB bus," Systems Signals and Devices (SSD), 2010 7th International Multi-Conference on, IEEE, Piscataway, NJ, USA, Jun. 27, 2010, pp. 1-6, XP031763386, ISBN: 978-1-4244-7532-2.

Texas Instruments, "TMS320x281x, 280x DSP Serial Peripheral Interface (SPI) Reference Guide," Internet Citation, Nov. 2004, XP002369243, Retrieved from the Internet: URL: http://focus.ti.com/lit/ug/spru059b/spru059b.pdf [retrieved on Feb. 22, 2006].

Japanese Office Action in 2014-524263, dated Jun. 30, 2015, with English translation.

* cited by examiner

MEASURED VALUE TRANSMITTING DEVICE

CROSS REFERENCE TO RELATED APPLICATIONS

This application is the National Stage of PCT/DE2011/001576 filed on Aug. 11, 2011, the disclosure of which is incorporated by reference. The international application under PCT article 21(2) was not published in English.

The invention relates to a measured value transmitting device for serial data transmission between a slave and a master in accordance with the SSI method (Synchronous Serial Interface), in which a measured value detected by a sensor is conditioned by a slave associated with the sensor and is converted into a serial data stream and is transmitted to a master which processes the detected measured values.

Such a measured value transmitting device, which is known as a result of its operating method as a "Synchronous Serial Interface (SSI)", has been described in the published application EP 171 579 A1. The measured value transmitting device contains a master and at least one slave. The slaves are associated with the sensors, wherein several sensors may optionally be associated with a slave. The measured values detected by a sensor are provided by the sensor already in digital form as data bits. The data bits are continuously loaded in the slave into a shifting register within the scope of parallel operation. The shifting register can store the data bits of the measured value in parallel operation and subsequently provide said data bits in serial operation for serial data transmission. During parallel operation, numerous measured values can be saved by the sensor to the shifting register depending on the delivery rate of the measured values or data bits, and can be replaced again by updated, newly detected measured value without a measured value being stored and serially transmitted to the master.

The master, in which the processing and the evaluation of the data bits representative of the measured values occurs, requests the data bits of a measured value within the scope of a clock burst from a selected slave. The clock burst comprises a fixed number of clock cycles. The number of the clock cycles is known both to the slave and also to the master. The first predetermined clock edge recognized by the slave, e.g. the first falling clock edge, triggers a monostable flip-flop, whose output signal will switch the shifting register from parallel operation to serial operation. The parallel applied data bits of a measured value, which are representative of the detected measured value at this point in time, are stored in the shifting register simultaneously with the first clock edge and provided for serial data transmission.

A data bit of the measured value is transmitted from the slave to the master with each further predetermined clock edge, e.g. each falling clock edge. Furthermore, each failing clock edge (re-)triggers the monostable flip-flop. The number of the clock cycles is precisely adjusted to the number of the data bits to be transmitted. For a number n of data bits to be transmitted, n+1 clock cycles are output by the master within a clock burst.

After the transmission of the last data bit of the measured value, the output signal of the monostable flip-flop ensures up until the expiration of the time predetermined by the re-triggerable monostable flip-flop that the data line is held at a predetermined data signal level, such that the shifting register still remains in serial operation for the monoflop time. A waiting period is thus defined. The master recognizes the data signal level held by the slave during the waiting period and makes the respective slave transmit the data bits of a new measured value only after the expiration of the waiting period.

The published application DE 101 13 716 A1 describes serial communication with a start/stop interface, which connects a position or velocity sensor associated with a slave to a master.

The published application EP 1 294 119 A1 describes an interface for serial transmission of measured values, in which check bits are appended to the data bits, which check bits are obtained from a cyclic redundancy check. The known method is also known as a "Cyclic Redundancy Check" (CRC method).

The CRC method concerns a procedure in which the serial data bits provided by a data source are regarded as a polynomial and are divided by a predetermined generator polynomial in order to transmit the obtained remainder of the division to the data receiver as check bits appended to the data bits. The same division is performed in the receiver by the generator polynomial with all received bits, i.e. the data bits and the check bits. The value zero without remainder must be obtained in the division by including the transmitted check bits in the division. The bits were transmitted correctly only in this case. The CRC method is described in detail for example under the internet address http://en.wikipedia.org/wiki/Cyclic redundancy check.

The invention is based on the object of providing measured value transmitting devices with serial data transmission between a slave and a master according to the SSI method which offer high data security.

This object is respectively achieved by the features stated in the ancillary independent claims.

DISCLOSURE OF THE INVENTION

The measured value data transmitting device according to a first embodiment relates to serial data transmission according to the SSI method, in which at least one slave is provided which provides the data bits of a measured value detected by at least one sensor for the purpose of serial bit-by-bit transmission to a master on at least one data line, and in which the master requests a measured value from the slave by means of a clock burst which is provided on at least one clock line and which comprises several clock cycles, the number of which matches the number of the data bits to be transmitted. The measured value transmitting device in accordance with the invention is characterized in that the clock cycles of the clock burst have a specified duty cycle which corresponds to the ratio of pulse duration to the period duration of one clock cycle, and the master contains a comparator, and said master reads back the clock bursts outputted on the at least one clock line and checks the duty cycle in the comparator to determine whether said cycle exceeds an upper threshold and/or falls below a lower threshold.

The measured value data transmitting device according to the invention increases security of data transmission by recognizing errors of the clock signal issued by the master. Interference pulses which are superimposed on the clock signal can lead to consequence in the slave that a clock cycle or even several clock cycles too many are detected. Interference pulses, which must be expected especially in industrial production, can be caused for example by electromagnetic influences on the clock lines, which originate from high currents and changes in the current. A wrong number of clock cycles within a clock burst would lead to an erroneous transmission of measured values. Such errors in the transmission of measured values are prevented by the measures in accordance with the invention.

The master, which determines the clock signal itself, also checks the clock signal that it has just provided for adhering to the predetermined duty cycle, which is defined as the ratio of pulse duration to the period duration of one clock cycle. In this case, either a low level or a high level can be designated as the pulse duration. A low-level will be regarded below as the active signal level, so that the pulse duration shall correspond to the duration of the low-level.

Another measured value transmitting device in accordance with the invention is also based on serial data transmission according to the SSI method, in which at least one slave is provided which provides the data bits of at least one measured value detected by a sensor for bit-by-bit serial transmission on at least one data line to a master, and in which the master requests a measured value from the slave by means of a clock burst which is provided on at least one clock line and which comprises several clock cycles, the number of which is adjusted to the number of the data bits to be transmitted. This measured value transmitting device is again characterized in that the clock cycles of the clock burst have a predetermined duty cycle, which corresponds to the ratio of pulse duration to period duration of one clock cycle, wherein the slave contains a comparator however in which the slave checks the duty cycle to determine whether said cycle exceeds an upper threshold and/or falls below a lower threshold.

The checking of the duty cycle for the adherence to at least one predetermined threshold also increases the security of measured value transmission by recognizing errors in clock cycles of a clock burst of the at least one clock signal.

Preferably, both measures in accordance with the invention are combined, so that both the comparator in the master and also the comparator in the slave are provided for checking the duty cycle. This increases the security especially in the case of measured value transmitting devices in which the master and the slaves are separated far from each other spatially and relatively long clock lines are required accordingly.

One relevant advantage of the measured value transmitting device in accordance with the invention is that the initially described established SSI method can be maintained, so that only few changes are necessary in the known hardware.

A magnetostrictive position or velocity sensor is provided as a sensor of the measured value transmitting device in accordance with the invention, which sensor is described for example in closer detail in the specification DE 10 2004 025 388 B4 that originates from the applicant.

Advantageous embodiments and further developments of the measured value transmitting device in accordance with the invention are the subject matter of the dependent claims.

Embodiments of the invention are shown in the drawing and will be explained below in closer detail by reference to the description.

DETAILED DESCRIPTION OF THE PREFERRED EMBODIMENTS

Figure 1:
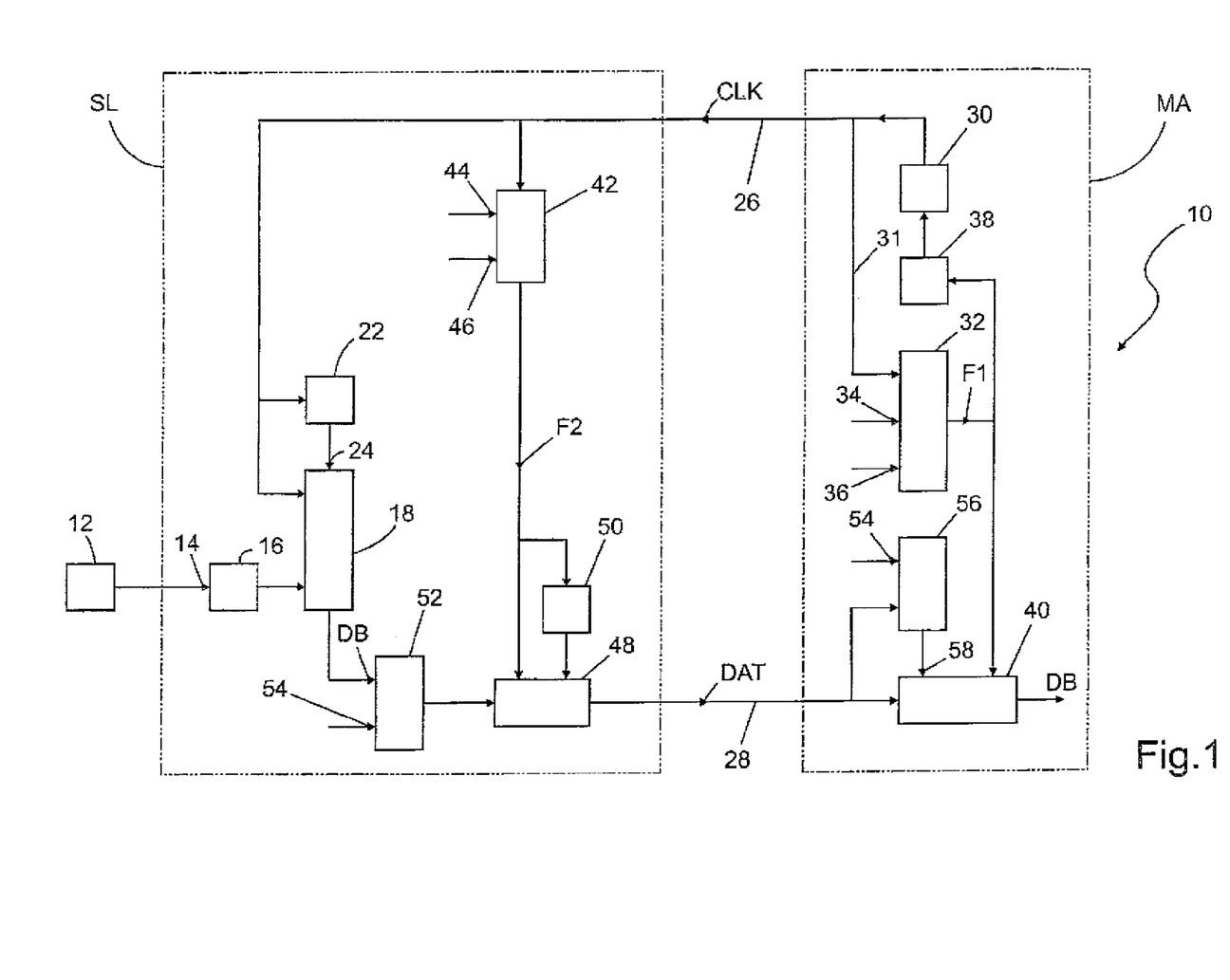
FIG. 1 shows a block diagram of a measured value transmitting device in accordance with the invention with a master and a slave.

FIG. 1 shows a measured value transmitting device 10, which contains a master MA and at least one slave SL. A measured value 14 which is detected by a sensor 12 is provided by the sensor 12 either in analog form or already digitized. In the event of a provision of the measured value 14 as an analog signal, an analog-to-digital converter 16 is provided, which is either arranged in the sensor 12 or in the slave SL. The measured value 14 is stored in a data provision arrangement 18 and is made available for later data transmission.

Figures 2, 3:
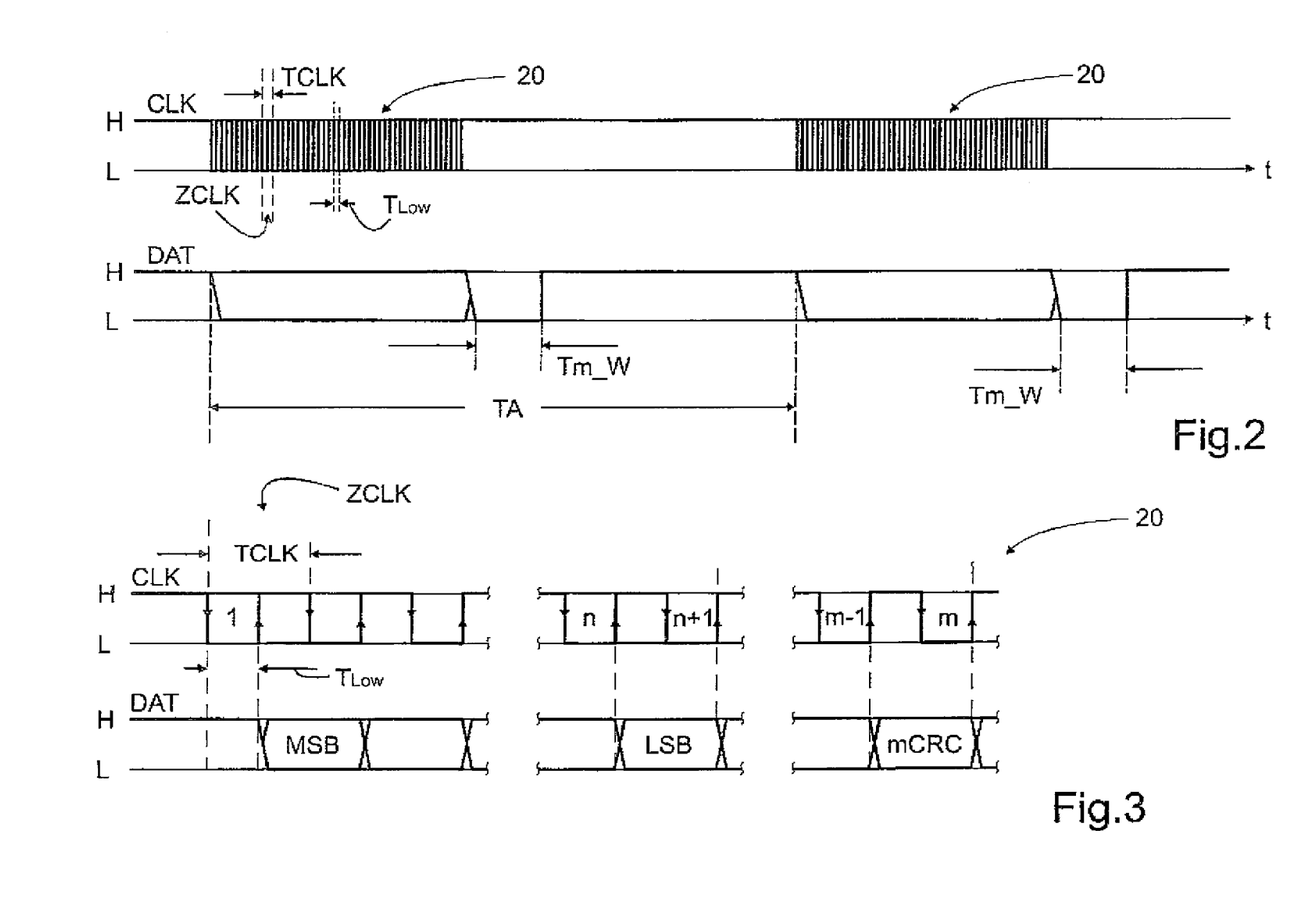
FIG. 2 shows the principal signal transmission between a master and a slave.
FIG. 3 shows the signal exchange shown in FIG. 2 in greater detail.

The measured value transmission is controlled by the master MA by means of a clock signal CLK. At first, the master MA requests the data bits DB of a measured value 14 provided by the slave SL by means of the clock signal CLK. The clock signal CLK is shown in FIGS. 2 and 3 in greater detail. For the purpose of a data request, the master MA sends the respective slave SL a clock burst 20 within the scope of the clock signal CLK, which comprises a predetermined number of clock cycles ZCLK with a specific clock period duration TCLK. The number of the clock cycles ZCLK is known to the slave SL. The duty cycle TLow/TCLK within a clock period duration TCLK, which indicates for example the duration TLow of the L level relating to the clock period duration TCLK, is fixedly predetermined and fixed at 50% for example.

FIG. 2 shows an interval of the clock signal CLK, which contains two clock bursts 20, whereas FIG. 3 shows the signals in detail which occur during a clock burst 20. In FIG. 2, the predetermined number of clock cycles ZCLK of a clock burst 20 can only be shown in a tightly packed way due to the large number of clock cycles ZCLK during a clock burst 20.

A magnetorestrictive position sensor or velocity sensor is provided as the sensor 12, which has already been described for example in the aforementioned patent specification DE 10 2004 025 388 B4, to which reference is made here. Such a sensor 12 can provide a high-resolution measured value 14 with a data bit width of 16 bits to 48 bits for example. The measured value 14 can be representative of a position or also a velocity which can be determined from the position.

The number of the data bits DB is designated below with n. In the underlying synchronous serial data transmission, n+1 clock cycles ZCLK are assumed for the transmission of n data bits DB. The clock signal CLK is at the high-level H for example in the idle state. The transmission of the data signal DAT occurs during the clock bursts 20, wherein the data bits DB are transmitted serially bit-by-bit from the slave SL to the master MA within the scope of the data signal DAT. In this case too, the high-level H of the data signal DAT in the idle state is also assumed for example.

The first dropping edge of the clock signal CLK at the beginning of a clock burst 20 ensures that the data provision arrangement 18 stores the measured value 14 which is currently provided by the sensor 12 and is optionally digitized in the analog-to-digital converter 16, and said data provision arrangement keeps the measured value ready for the subsequent measured value transmission. A timer 22 is provided for controlling the data provision arrangement 18, which timer is triggered with the first dropping edge of the dock signal CLK. The occurrence of the switching signal 24 of the timer 22 triggers the data provision arrangement 18 for accepting in parallel the digitally provided measured value 14 and for storing the data bits DB of the measured value 14.

The provision rate of the individual measured values 14 by the sensor 12 can deviate substantially from the signal processing in the slave SL. The rate can either be slower or faster than the clock period duration TCLK. It is only relevant that the currently available measured value 14 is stored with a clock edge, e.g. the first dropping clock edge, in the data provision arrangement 18.

The data provision arrangement 18 provides the first data bit DB with the first rising clock edge of the clock signal CLK. This preferably concerns the most significant bit (Most Significant Bit—MSB). The next data bit DB is provided with each further rising clock edge. The least significant bit (Least Significant Bit—LSB) is provided with the last but one rising clock edge of the clock cycle n+1 and transmitted to the master.

A waiting signal Tm_W is provided with the last clock edge of the clock burst 20, during which the data signal DAT assumes a predetermined level. This is the low-level in the illustrated embodiment. The master MA recognizes a blocked state of the slave SL on the basis of the waiting time Tm_W and waits accordingly before sending out the next clock burst 20. The waiting time Tm_W can therefore also be referred to as blocking time. The waiting time Tm_W signalizes the master MA that the slave SL is not yet ready for a further transmission of the data bit DB of a new measured value 14. The brief blocking of the measured value transmission ensures that the data bits DB of a defined measured value 14 can be stored in the slave SL at the beginning of a clock burst 20.

The master MA requests the data bits DB of a new measured value 14 by means of a new clock burst 20 at the earliest after the expiration of the waiting time Tm_W. The time from clock burst to clock burst 20 is entered in FIG. 2 as the query time TA. If a periodic or quasi-periodic data transmission is triggered by the master MA, the query time TA can also be designated as clock burst period duration. The master MA requests the transmission of the data bits DB of a new measured value 14 from the slave SL by outputting the next clock burst 20.

Based on the operating mode, the data transmission in the measured value transmitting device 10 is known as synchronous serial data transmission or as "Synchronous Serial Interface (SSI)", which is established, so that all masters MA and slaves SL which use the SSI method can be connected.

The clock signal CLK, which is transmitted on a clock line 26 from the master MA to the slave SL, is highly important for proper data transmission on the basis of the functional principle. If the number n of the clock cycles ZCLK expected in the slave does not occur or if more than expected clock cycles ZCLK are recognized, the data signal DAT transmitted on a data line 28 will not be interpreted correctly in the master MA and there is an erroneous measured value transmission.

It is provided according to a first embodiment of the invention that the clock signal CLK generated by a clock generator 30 in the master MA is read back and evaluated by the master MA itself. The readback means that the master MA reads in the clock signal CLK again, which was generated by its clock generator 30 and provided on the clock line 26, via a return feed line 31 from the clock line 26 and evaluates said signal itself. The clock signal CLK is supplied via a return feed line 31 to a first comparator 32 arranged in the master MA. The first comparator 32 evaluates the duty cycle TLow/TCLK by comparison with an upper and/or lower threshold value 34, 36.

The at least one threshold value 34, 36 is determined for example in such a way that any exceeding of the duty cycle TLow/TCLK of 10% for example and a respective falling below said value lead to a first error signal F1, which is provided for example to a clock repetition arrangement 38 and a data signal release 40.

Figure 4A:
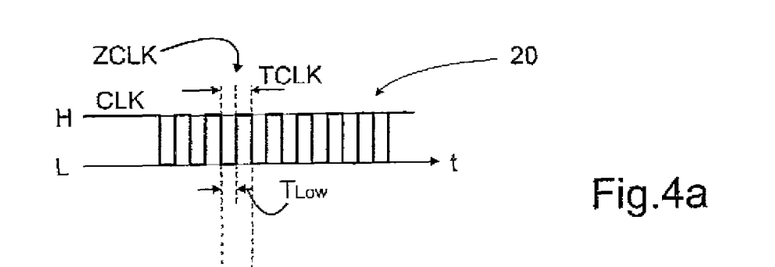
FIGS. 4a to 4c show a signal exchange between a master and a slave, in which a duty cycle of a clock cycle of a clock burst is disturbed.
Figure 4B:
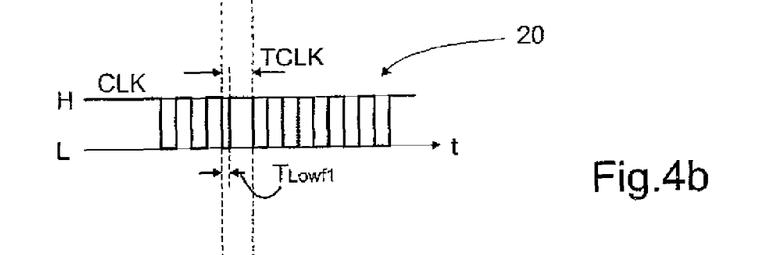
Figure 4C:
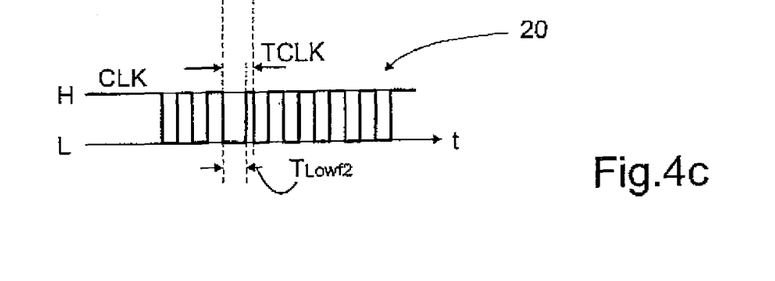

FIG. 4a assumes a correct duty cycle TLow/TCLK. FIG. 4b shows an erroneous duty cycle TLowf1/TCLK, in which the pulse duration TLowf1 is erroneously too short and therefore falls beneath the lower threshold value 36, whereas FIG. 4c shows the case of a pulse duration TLowf2 which is too Long and which exceeds the upper threshold value 34.

The first error signal F1 triggers the clock repetition arrangement 38 for example for renewed output of the clock burst 20 which is affected by the error. The first error signal F1 preferably simultaneously acts as a blocking signal, which blocks the data signal release 40 in the respect that the data signal DAT received within the clock burst 20 and recognized as erroneous will be rejected or the output of the received data bits DB is blocked.

The readback of the own clock signal CLK and the comparison of the duty cycle TLow/TCLK of the clock cycles ZCLK of the readback clock burst 20 in the comparator 32 with the upper and/or lower threshold value 34, 36 leads to high security in the measured value transmission.

It is provided according to a second embodiment of the invention that a second comparator 42 is provided in the slave SL, which comparator also compares the duty cycle TLow/TCLK of the clock cycles ZCLK of the clock burst 20 of the clock signal CLK with an upper and/or lower threshold value 44, 46. The at least one threshold value 44, 46 can be identical to the threshold value 34, 36 provided in the master MA. The at least one threshold value 44, 46 in the slave SL can also deviate from the at least one threshold value 34, 36 of the master MA. The at least one threshold value 34, 36 provided in the master MA can be designated as master-related threshold value 34, 36 and the at least one threshold value 44, 46 provided in the slave SL can be designated as slave-related threshold value 44, 46.

The second comparator issues a second error signal F2 if the duty cycle TLow/TCLK exceeds or falls below a threshold value 44, 46. The second error signal F2 is made available for example to a data signal conditioning system 48 and optionally an error signal generator 50.

The different errors and their recognition correspond to those that have already been explained with respect to FIGS. 4b and 4c.

The second error signal F2 triggers the data signal conditioning system 48 to suppress the output of the remaining data bits DB in a clock burst 21 once an error has been recognized.

The evaluation of the duty cycle TLow/TCLK in the second comparator 42 of the slave SL by comparison with the upper and/or lower threshold value 44, 46 also ensures high security in the transmission of the measured values.

The combination of the two embodiments in accordance with the invention is especially appropriate, in which the first comparator 32 is provided in the master MA and the second comparator 42 in the slave SL, thus achieving a further increase in the security in the transmission of the measured values.

One embodiment provides the use of the known CRC method, which was already described initially. A CRC generator 52 is provided for this purpose in the slave SL, which generator regards the serially available data bits DB as a polynomial which is divided by a predetermined CRC generator polynomial 54. The obtained remainder of the division is appended to the data bits DB as CRC check bits, wherein a number m of CRC check bits mCRC are provided. FIG. 3 shows that the CRC check bits mCRC are appended to the LSB of the data bits DB.

The master MA contains a CRC checking arrangement 56, which is provided with the same CRC generator polynomial 54 as the CRC generator 52 in the slave SL. The same division through the CRC generator polynomial 54 is performed in the CRC checking arrangement 56 with all received bits, i.e. the data bits DB and the CRC check bits mCRC. The value zero without remainder must be obtained in a correct transmission of the value as a result of the inclusion of the transmitted CRC check bits mCRC in the division. The entire bit sequence was only correctly transmitted in this case. This especially leads to the consequence that the data bits DB were transmitted correctly to the master MA. Only in this case will the CRC checking arrangement 56 provide a release signal 58, which signalizes to the data signal release 40 that the data bits DB are valid and can be released for further processing.

The polynomials 0xA412 or 0x86C or 0xADC9 are preferably provided as CRC generator polynomials 54, corresponding to $x^{16}+x^{14}+x^{11}+x^5+x^2+1$ or $x^{16}+x^{15}+x^{12}+x^7+x^6+x^4+x^3+1$ or $x^{16}+x^{14}+x^{12}+x^{11}+x^9+x^8+x^7+x^4+x+1$.

Preferably, 16 CRC check bits mCRC are appended to the data bits DB.

Figure 5:
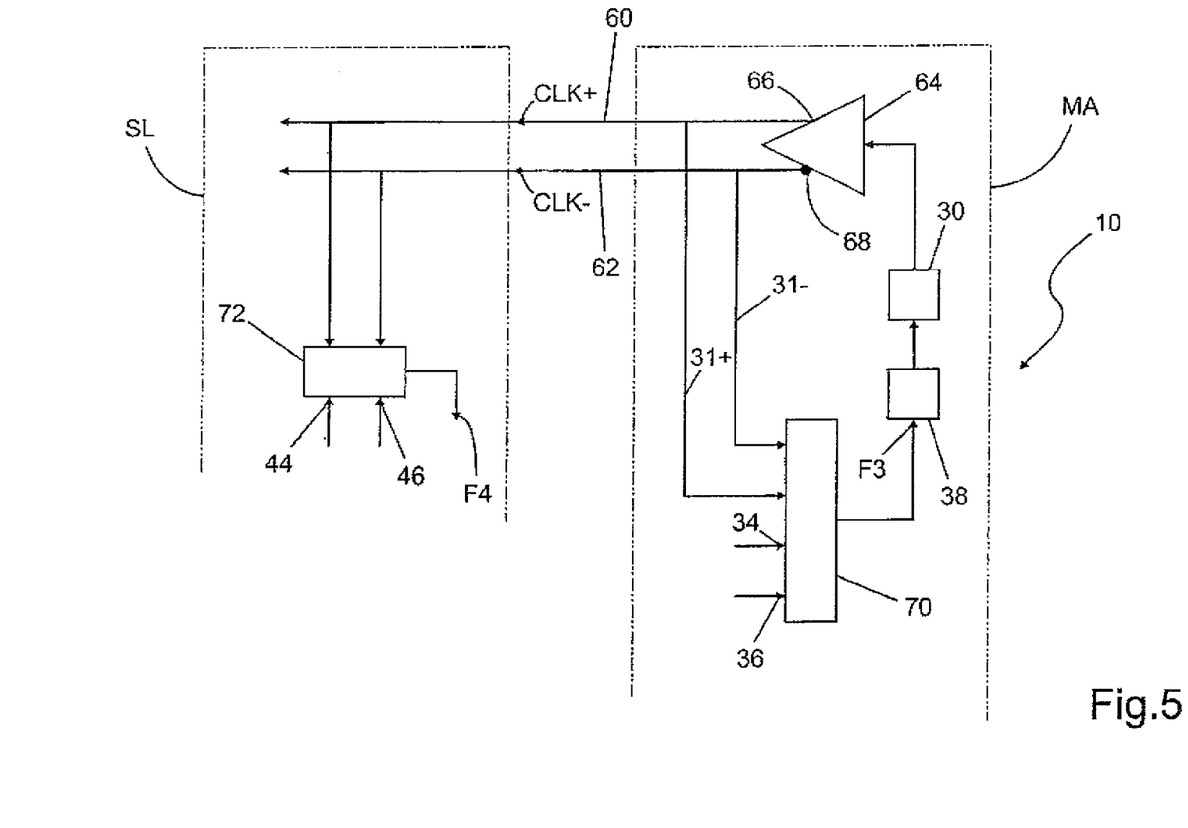
FIG. 5 shows a block diagram of another measured value transmitting device in accordance with the invention with a master and a slave.

A further increase in the security is achieved in such a way that the clock line 26 as shown in FIG. 1 is divided into two clock lines 60, 62, on which a differential clock signal CLK+, CLK− is transmitted. An embodiment is shown in FIG. 5. The master MA contains a bus driver 64, which comprises a non-inverted output 66 and an inverted output 68, wherein the first clock signal CLK+ is to be output on the non-inverted output 66 with the first clock bursts 20+ and the second clock signal 62 with the second clock bursts 20− on the inverted output 68.

At least one of the two differential clock signals CLK+, CLK−, or preferably both signals CLK+, CLK−, is also read back in this embodiment by the master MA and the duty cycle TLow+/TCLK+, TLow−/TCLK− of the clock cycles ZCLK+, ZCLK− of the clock bursts 20+, 20− of at least one differential clock signal CLK+, CLK− is compared in a third comparator 70 with the at least one threshold value 34, 36. The readback also means in this case that at least one of the clock signals CLK+, CLK− provided on the clock lines 60, 62 by the master MA is immediately read again via at least one return feed line 31+, 31− and is supplied to the third comparator 70. The upper and the lower threshold value 34, 36 are preferably also provided in this case, with which the duty cycle TLow+/TCLK+, TLow−/TCLK− of at least one differential clock signal CLK+, CLK−, preferably both differential clock signals CLK+, CLK−, is compared. If the threshold is exceeded or the value falls beneath the threshold, a third error signal F3 is provided which is again made available to the clock repetition arrangement 38, which triggers the clock generator 34 for a renewed output of a clock burst 20+, 20−. Further signal processing in the master MA can be realized according to the embodiment of the measured value transmitting device 10 in accordance with the invention which is shown in FIG. 1.

Accordingly, the duty cycle TLow+/TCLK+, TLow−/TCLK− of the clock cycles ZCLK+, ZCLK− of the clock burst 20+, 20− of at least one differential clock signal CLK+, CLK− can again be compared in the slave SL in a fourth comparator 72 with at least one threshold value 44, 46 according to the second embodiment of the measured value transmitting device 10 in accordance with the invention, which will provide a fourth error signal F4 in the case of an error. The further signal processing in the slave SL can occur according to the embodiment of the measured value transmitting device 10 in accordance with the invention as illustrated in FIG. 1.

Figure 6A:
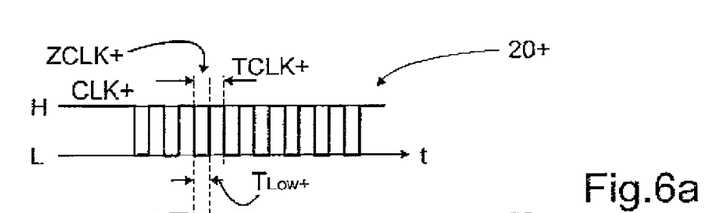
FIGS. 6a to 6d show a signal exchange between a master and a slave according to FIG. 5, in which a duty cycle of a clock cycle of a clock burst is disturbed on one of two clock lines.
Figure 6B:
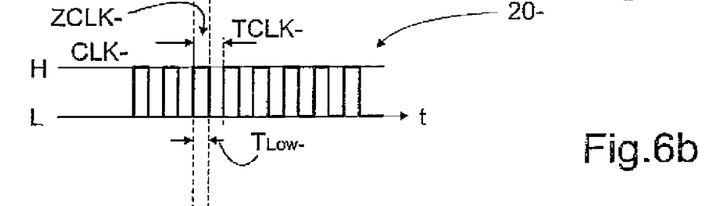

Parts of the clock bursts 20+, 20− of the two differential clock signals CLK+, CLK− are shown in FIGS. 6a and 6b. The low-levels for the formation of the duty cycle TLow+/TCLK+, TLow−/TCLK− are used again in this case by way of example. Furthermore, reference is made to the low-level TLow− despite the inverted idle level of the second differential clock signal CLK−.

Figure 6C:
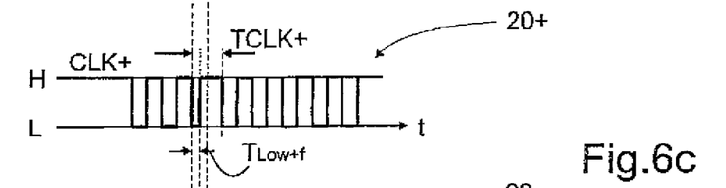

In the illustrated embodiment according to FIG. 6c, at least one erroneous duty cycle TLow+f/TCLK+ has occurred in a first clock burst 20+ only in the first differential clock signal CLK+, which has fallen beneath the lower threshold value 36, 46 in the master MA and/or in the slave SL for example.

Figure 6D:
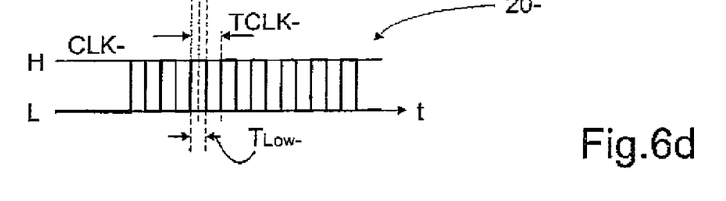

It is assumed by way of example according to FIG. 6d that the pulse durations TLow− of the clock cycles ZCLK− of the second clock bust 20− of the second differential clock single CLK− and therefore the duty cycles TLow−/TCLK− have remained free of errors during the second clock burst 20−. Although no threshold value 34, 36, 44, 46 was exceeded in this case or no value has fallen below said threshold, the third and/or fourth error signal F3, F4 is still provided in this case by the third or fourth comparator 70, 72 because a duty cycle TLow+f/CLK of at least one clock cycles ZCLK+ of a first clock burst 20+ of the first differential clock signal CLK+ was recognized as erroneous.

The invention claimed is:

1. A measured value transmitting device for serial data transmission from at least one slave (SL) which provides the data bits (DB) of a measured value (14) detected by at least one sensor (12) for the purpose of serial bit-by-bit transmission to a master (MA) on at least one data line (28), and in which the master (MA) requests a measured value (14) from the slave (SL) by means of a clock burst (20, 20+, 20−) which is provided on at least one clock line (26, 60, 62) and which comprises several clock cycles (ZCLK, ZCLK+, ZCLK−), the number of which (n+1) matches the number (n) of the data bits (DB) to be transmitted, wherein the clock cycles (ZCLK, ZCLK+, ZCLK−) of the clock burst (20, 20+, 20−) have a specified duty cycle (TLow/TCLK, TLow+/TCLK+, TLow−/TCLK−) which corresponds to the ratio of pulse duration (TLow, TLow+, TLow−) to the period duration (TCLK, TCLK+, TCLK−) of one clock cycle (ZCLK, ZCLK+, ZCLK−), and the master (MA) contains a comparator (32, 70), and said master MA) reads back the clock bursts (20, 20+, 20−) outputted on the at least one clock line (26, 60, 62) and checks the duty cycle (TLow/TCLK, TLow+/TCLK+, TLow−/TCLK−) in the comparator (32, 70) to determine whether said cycle exceeds an upper threshold (34) and/or falls below a lower threshold (36).

2. A measured value transmitting device for serial data transmission from at least one slave (SL) which provides the data bits (DB) of a measured value (14) detected by at least one sensor (12) for the purpose of serial bit-by-bit transmission to a master (MA) on at least one data line (28), and in which the master (MA) requests a measured value (14) from the slave (SL) by means of a clock burst (20, 20+, 20−) which is provided on at least one clock line (26, 60, 62) and which comprises several clock cycles (ZCLK, ZCLK+, ZCLK−), the number of which (n+1) matches the number (n) of the data bits (DB) to be transmitted, wherein the clock cycles (ZCLK, ZCLK+, ZCLK−) of the clock burst (20, 20+, 20−) have a specified duty cycle (TLow/TCLK, TLow+/TCLK+, TLow−/TCLK−) which corresponds to the ratio of pulse duration (TLow, TLow+, TLow−) to the period duration (TCLK, TCLK+, TCLK−) of one clock cycle (ZCLK, ZCLK+, ZCLK−), and the slave (SL) contains a comparator (42, 72) and checks the duty cycle (TLow/TCLK, TLow+/TCLK+, TLow−/TCLK−) in the comparator (42, 72) to determine whether said cycle exceeds an upper threshold (44) and/or falls below a lower threshold (46).

3. A measured value transmitting device for serial data transmission from at least one slave (SL) which provides the data bits (DB) of a measured value (14) detected by at least one sensor (12) for the purpose of serial bit-by-bit transmission to a master (MA) on at least one data line (28), and in which the master (MA) requests a measured value (14) from the slave (SL) by means of a clock burst (20, 20+, 20−) which is provided on at least one clock line (26, 60, 62) and which comprises several clock cycles (ZCLK, ZCLK+, ZCLK−), the number of which (n+1) matches the number (n) of the data bits (DB) to be transmitted, wherein the clock cycles (ZCLK, ZCLK+, ZCLK−) of the clock burst (20, 20+, 20−) have a specified duty cycle (TLow/TCLK, TLow+/TCLK+, TLow−/TCLK−) which corresponds to the ratio of pulse duration (TLow, TLow+, TLow−) to the period duration (TCLK, TCLK+, TCLK−) of one clock cycle (ZCLK, ZCLK+, ZCLK−), and the master (MA) contains a comparator (32, 70), and said master MA) reads back the clock bursts (20, 20+, 20−) outputted on the at least one clock line (26, 60, 62) and checks the duty cycle (TLow/TCLK, TLow+/TCLK+, TLow−/TCLK−) in the comparator (32, 70) to determine whether said cycle exceeds an upper threshold (34) and/or falls below a lower threshold (36), and the slave (SL) contains a comparator (42, 72) and checks the duty cycle (TLow/TCLK, TLow+/TCLK+, TLow−/TCLK−) in the comparator (42, 72) to determine whether said cycle exceeds an upper threshold (44) and/or falls below a lower threshold (46).

4. A measured value transmitting device according to claim 1, wherein two clock lines (60, 62) are provided, via which the first and second clock bursts (20+, 20−) are transmitted as differential clock bursts (20+, 20−) by means of a non-inverted and an inverted clock burst (20+, 20−), and the comparator (32, 70) contained in the master (MA) checks the corresponding duty cycles (TLow+/TCLK+, TLow−, TCLK−) of the clock cycles (ZCLK+, ZCLK−) of the non-inverted and/or inverted clock burst (20+, 20−) to determine whether said cycle exceeds the upper threshold (34) and/or falls below the lower threshold (36).

5. A measured value transmitting device according to claim 2, wherein two clock lines (60, 62) are provided, via which the first and second clock bursts (20+, 20−) are transmitted as differential clock bursts (20+, 20−) by means of a non-inverted and an inverted clock burst (20+, 20−), and the comparator (42, 72) contained in the slave (SL) checks the duty cycles (TLow+/TCLK+, TLow−, TCLK−) of the clock cycles (ZCLK+, ZCLK−) of the non-inverted and/or inverted clock burst (20+, 20−) to determine whether said cycle exceeds the upper threshold (44) and/or falls below a lower threshold (46).

6. A measured value transmitting device according to claim 1, wherein the master (MA) contains a clock repetition arrangement (38) which triggers the repetition of the output of the clock burst (20, 20+, 20−) in case of an established error.

7. A measured value transmitting device according to claim 1, wherein the master (MA) contains a data signal release (40) which evaluates the received data signal (DAT) as being invalid in the case of an established error.

8. A measured value transmitting device according to claim 2, wherein the slave (SL) contains an error signal generator (50) which provides an error data bit sequence for serial transmission to the master (MA) when an error has occurred.

9. A measured value transmitting device according to claim 1, wherein the slave (SL) contains a CRC generator (52), which depending on the data bits (DB) and a predetermined CRC generator polynomial (54) determines CRC check bits (mCRC) which are appended to the data bits (DA) prior to transmission to the master (MA).

10. A measured value transmitting device according to claim 9, wherein 16 CRC check bits (mCRC) are provided.

11. A measured value transmitting device according to claim 9,
wherein polynomials 0xA412 or 0xC86C or 0xADC9 are provided as CRC generator polynomials (54), corresponding to $x^{16}+x^{14}+x^{11}+x^{5}+x^{2}+1$ or $x^{16}+x^{15}+x^{12}+x^{7}+x^{6}+x^{4}+x^{3}+1$ or $x^{16}+x^{14}+x^{12}+x^{11}+x^{9}+x^{8}+x^{7}+x^{4}+x+1$.

12. A measured value transmitting device according to claim 9, wherein the master (MA) contains a CRC checking arrangement (56), which carries out the CRC check depending on the polynomial (54), the received data bits (DA) and the received CRC check bits (mCRC).

13. A measured value transmitting device according to claim 1, wherein a magnetorestrictive position or velocity sensor is provided as a sensor (12).

* * * * *